United States Patent
Van Der Toorn et al.

(10) Patent No.: US 7,119,876 B2
(45) Date of Patent: Oct. 10, 2006

(54) LITHOGRAPHIC APPARATUS AND DEVICE MANUFACTURING METHOD

(75) Inventors: Jan-Gerard Cornelis Van Der Toorn, Eindhoven (NL); Christiaan Alexander Hoogendam, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 6 days.

(21) Appl. No.: 10/966,111

(22) Filed: Oct. 18, 2004

(65) Prior Publication Data

US 2006/0082741 A1 Apr. 20, 2006

(51) Int. Cl.
*G03B 27/42* (2006.01)
*G03B 27/52* (2006.01)

(52) U.S. Cl. .......................... 355/53; 355/30
(58) Field of Classification Search .................. 355/30, 355/53, 55, 67; 359/380
See application file for complete search history.

(56) References Cited

U.S. PATENT DOCUMENTS

| | | | |
|---|---|---|---|
| 3,573,975 A | 4/1971 | Dhaka et al. ................ 117/212 |
| 3,648,587 A | 3/1972 | Stevens ........................... 95/44 |
| 4,346,164 A | 8/1982 | Tabarelli et al. ............. 430/311 |
| 4,390,273 A | 6/1983 | Loebach et al. ............. 355/125 |
| 4,396,705 A | 8/1983 | Akeyama et al. ........... 430/326 |
| 4,480,910 A | 11/1984 | Takanashi et al. ............ 355/30 |
| 4,509,852 A | 4/1985 | Tabarelli et al. .............. 355/30 |
| 5,040,020 A | 8/1991 | Rauschenbach et al. ...... 355/53 |
| 5,610,683 A | 3/1997 | Takahashi ..................... 355/53 |
| 5,715,039 A | 2/1998 | Fukuda et al. ................ 355/53 |
| 5,825,043 A | 10/1998 | Suwa .......................... 250/548 |
| 5,900,354 A | 5/1999 | Batchelder ................... 430/395 |
| 6,191,429 B1 | 2/2001 | Suwa .......................... 250/548 |
| 6,236,634 B1 | 5/2001 | Lee et al. .................... 369/112 |
| 6,560,032 B1 | 5/2003 | Hatano ........................ 359/656 |
| 6,600,547 B1 | 7/2003 | Watson et al. |
| 6,603,130 B1 | 8/2003 | Bisschops et al. ........ 250/492.1 |
| 6,633,365 B1 | 10/2003 | Suenaga ....................... 355/53 |
| 6,952,253 B1 * | 10/2005 | Lof et al. ..................... 355/30 |
| 6,980,277 B1 * | 12/2005 | Sewell ......................... 355/30 |
| 2002/0020821 A1 | 2/2002 | Van Santen et al. ......... 250/492 |
| 2002/0163629 A1 | 11/2002 | Switkes et al. ............... 355/53 |
| 2003/0123040 A1 | 7/2003 | Almogy ........................ 355/69 |
| 2003/0174408 A1 | 9/2003 | Rostalski et al. ........... 359/642 |
| 2004/0000627 A1 | 1/2004 | Schuster |
| 2004/0021844 A1 | 2/2004 | Suenaga |
| 2004/0075895 A1 | 4/2004 | Lin ............................. 359/380 |
| 2004/0109237 A1 | 6/2004 | Epple et al. |
| 2004/0114117 A1 | 6/2004 | Bleeker |
| 2004/0119954 A1 | 6/2004 | Kawashima et al. .......... 355/30 |
| 2004/0125351 A1 | 7/2004 | Krautschik .................... 355/53 |

(Continued)

FOREIGN PATENT DOCUMENTS

DE 206 607 2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Henry Hung Nguyen
(74) *Attorney, Agent, or Firm*—Pillsbury Winthrop Shaw Pittman LLP (57) ABSTRACT

To facilitate, for example, removal of a substrate between exposures of different substrates, an actuated closing plate is used to replace a substrate, a substrate table, or both, as a part of a boundary of a space in a lithographic apparatus containing liquid without, for example, breaking a seal containing the liquid.

24 Claims, 6 Drawing Sheets

U.S. PATENT DOCUMENTS

| | | | |
|---|---|---|---|
| 2004/0135099 | A1 | 7/2004 | Simon et al. |
| 2004/0136494 | A1 | 7/2004 | Lof et al. |
| 2004/0160582 | A1 | 8/2004 | De Smit et al. |
| 2004/0165159 | A1 | 8/2004 | Lof et al. |
| 2004/0207824 | A1 | 10/2004 | Lof et al. |
| 2004/0211920 | A1 | 10/2004 | Derksen et al. |
| 2004/0263809 | A1 | 12/2004 | Nakano ........................ 355/30 |
| 2005/0264780 | A1* | 12/2005 | Graeupner .................... 355/53 |
| 2005/0286032 | A1* | 12/2005 | Lof et al. ...................... 355/53 |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 3/2000 |
| EP | 1 420 299 A2 | 5/2004 |
| EP | 1 420 302 A1 | 5/2004 |
| EP | 1 586 948 A1 | 10/2005 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000/058436 | 2/2000 |
| JP | 2001-0919849 | 4/2001 |
| JP | 2004-193252 | 7/2004 |
| WO | WO 99/49504 | 9/1999 |
| WO | WO 03/077037 | 9/2003 |
| WO | WO 03/0770036 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 A2 | 10/2004 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50nm", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2 µm Fine Patterns Using Optical Projection Lithography with an Oil Immersion Lens", Jpn. J. Appl. Phys. vol. 31 (1992), pp. 4174-4177.

G. Owen et al., "1/8 µm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International, SEMATECH Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial $\lambda$/N scaling equations for resolution, depth of focus, and immersion lithography, *J. Microlith., Microfab., Microsyst.* 1(1):7-12 (2002).

European Search Report issued for European Application No. 05256431.7-2222, dated Feb. 2, 2006.

* cited by examiner

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
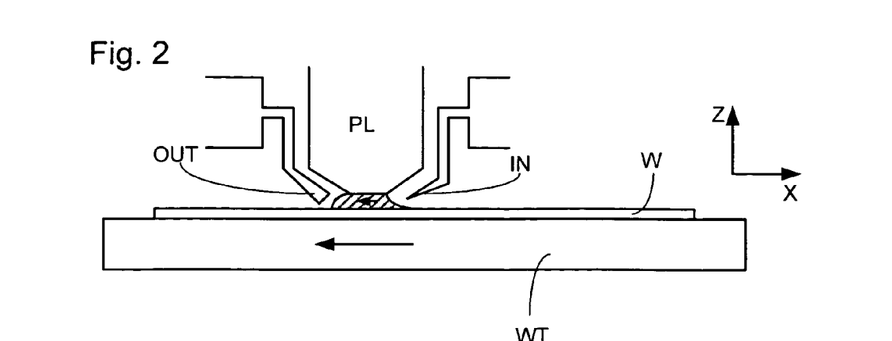
FIGS. 2 and 3 depict a liquid supply system for use in a lithographic projection apparatus.
Figure 3:
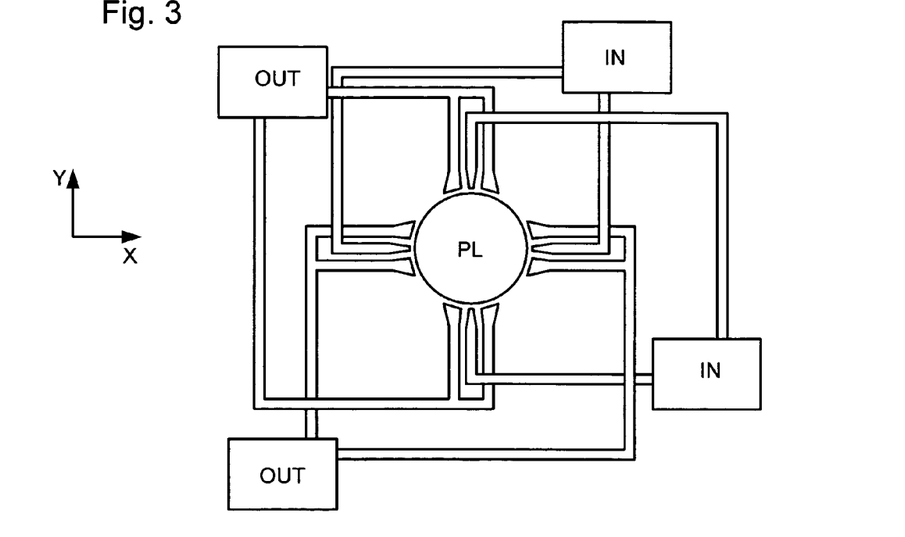

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

In an immersion lithography technique, a space between the projection system and the substrate is filled with a liquid (such as water). During exposure of the substrate, the substrate forms part of a boundary which contains the liquid. During removal of that substrate and replacement with another substrate, for example, the liquid may be drained from the space to allow for the substrate change. A possible downside to this approach is that drying spots may be formed on an element of the projection system in contact with the liquid. Additionally or alternatively, changes in the liquid and vacuum flow to remove the liquid may take time to settle, possibly leading to loss in throughput.

SUMMARY

Accordingly, it would be advantageous, for example, to keep an element of an immersion lithography apparatus projection system immersed during a removal of a substrate by swapping a closing plate for the substrate without disturbing the liquid which is present between the substrate and the optical element. By using another body (e.g., a closing plate) that fulfills the function of providing a boundary that contains the liquid, it may not be necessary to remove the liquid from between the substrate and the projection system during removal of the substrate (and supply of a new substrate).

According to an aspect of the invention, there is provided a lithographic projection apparatus, comprising:

a substrate table configured to hold a substrate;

a projection system configured to project a patterned beam of radiation onto the substrate;

a liquid confinement structure configured to confine a liquid in a space between the projection system and the substrate, the substrate, the substrate table, or both, configured to form a part of a boundary of the space; and a closing plate configured to form a part of a boundary of the space in place of the substrate, the substrate table, or both, when moved without substantially disturbing the liquid, the liquid confinement structure, or both.

According to a further aspect of the invention, there is provided a device manufacturing method, comprising:

providing a liquid to a space through which a patterned beam passes, a substrate, a substrate table, or both, forming a part of a boundary of the space;

sealing the liquid to the space, the seal acting between the substrate, a substrate table, or both, and another structure;

replacing the substrate, the substrate table, or both, with a closing plate as the part of the boundary of the space without breaking the seal; and projecting a patterned beam of radiation through the liquid onto the substrate.

According to another aspect of the invention, there is provided a lithographic projection apparatus, comprising:

a substrate table configured to hold a substrate;

a projection system configured to project a patterned beam of radiation onto the substrate;

a liquid confinement structure configured to confine a liquid in a space between the projection system and the substrate, the substrate, the substrate table, or both, configured to form a part of a boundary of the space;

a closing plate displaced in a horizontal plane from the substrate table and configured to form a part of a boundary of the space in place of the substrate, the substrate table, or both; and an actuator configured to move the closing plate in the horizontal plane.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
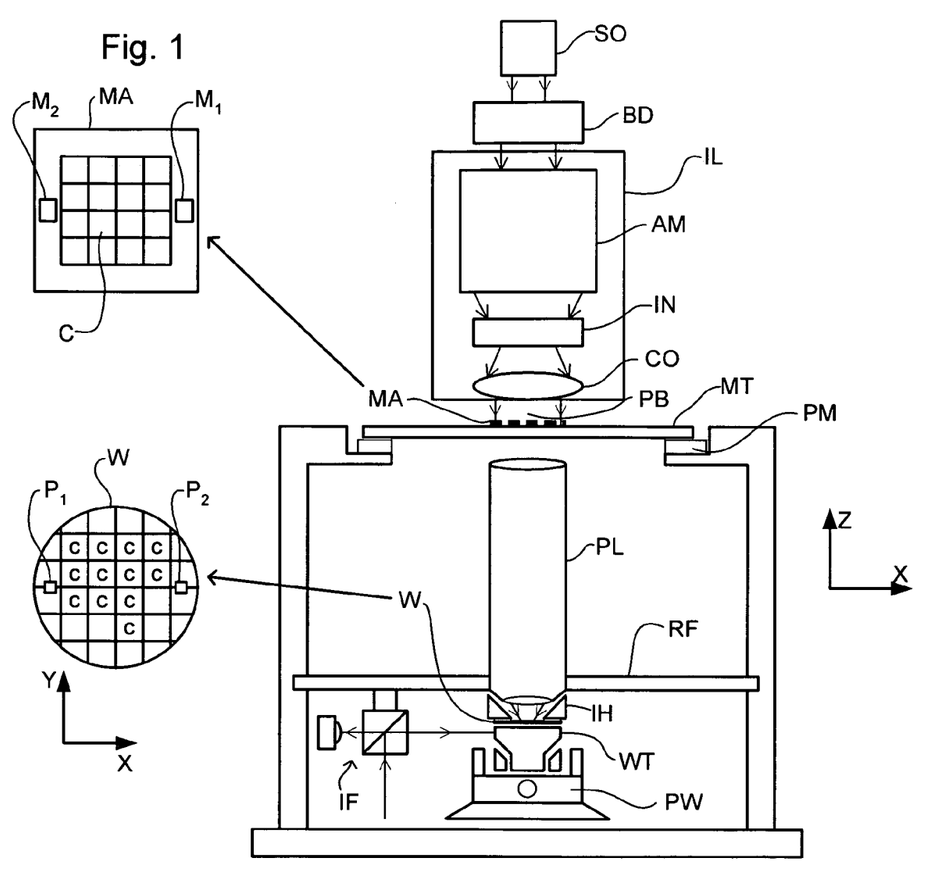
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam PB (e.g. UV radiation or DUV radiation).

a support structure (e.g. a mask table) MT constructed to hold a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
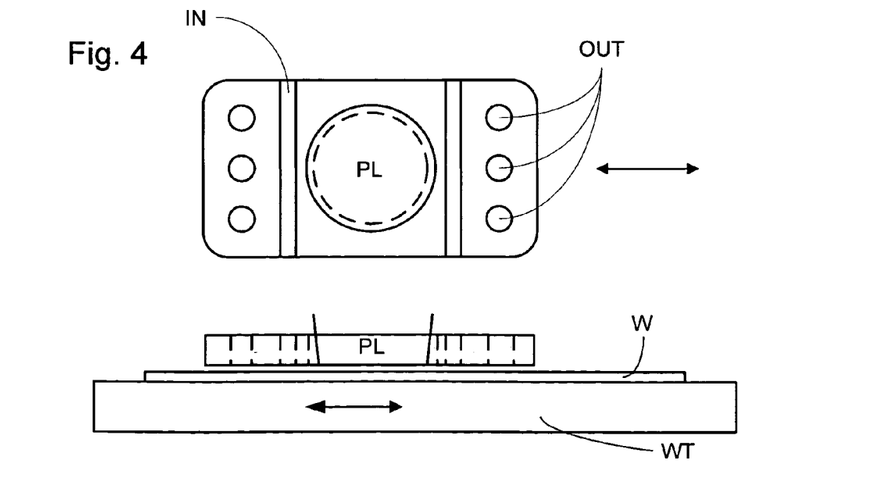
FIG. 4 depicts a further liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
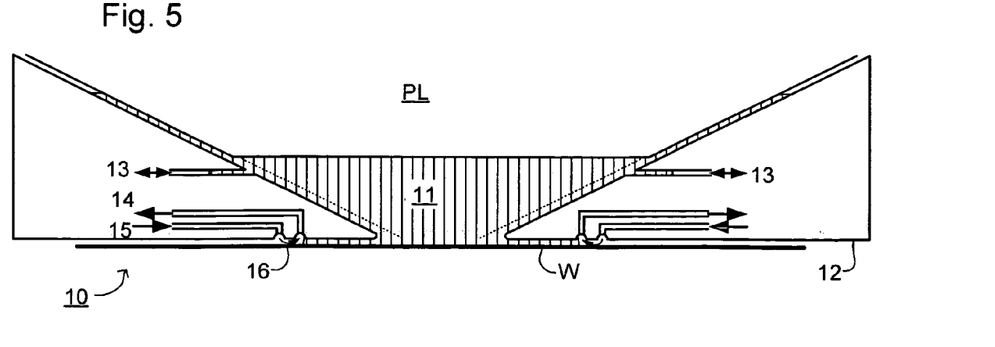
FIG. 5 depicts a close up view of another liquid supply system according to an embodiment of the present invention.

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, the seal is a contactless seal such as a gas seal. Such a system with a gas seal is disclosed in U.S. patent application Ser. No. 10/705,783, hereby incorporated in its entirety by reference.

Referring to FIG. 5, the reservoir 10 forms a contactless seal to the substrate around the image field of the projection system so that liquid is confined to fill a space between the substrate surface and the final element of the projection system. The reservoir is formed by a liquid confinement structure 12 positioned below and surrounding the final element of the projection system PL. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir by a seal 16 such as a gas seal between the bottom of the liquid confinement structure 12 and the surface of the substrate W. The gas seal may be formed by gas, e.g. air, synthetic air, $N_2$ or an inert gas, provided under pressure via inlet 15 to the gap between liquid confinement structure 12 and substrate and extracted via first outlet 14. The overpressure on the gas inlet 15, vacuum level on the first outlet 14 and geometry of the gap are arranged so that there is a high-velocity gas flow inwards that confines the liquid. It will be understood by the person skilled in the art that other types of seal could be used to contain the liquid.

According to an embodiment of the invention, an actuated closing plate 20 is provided which moves horizontally into position under the projection system, replacing the substrate table, which moves away from its position under the projection system horizontally. The top surface of the actuated closing plate 20 is positioned at a substantially equal height to the substrate table such that continuous, undisturbed motion is allowed when the substrate table is moved away from its position under the projection system, while the seal containing the liquid in the liquid confinement structure is maintained. Part of one or more long-stroke actuators which are used to move the substrate table may also be used for horizontal actuation of the closing plate. As described in more detail below, active compensation of the change in vertical load on the substrate table, when the force associated with the liquid confinement structure 12 is moved from the substrate table to the closing plate, may also be employed. The actuated closing plate 20 is positioned and/or shaped such that it does not block any interferometer beams during measurement by these beams.

One or more advantages of supplying an actuated closing plate may include a faster substrate exchange, maintenance of gas, liquid and vacuum flows in and around the liquid confinement structure at a substantially constant level (thus possibly reducing settling times and decreasing the likelihood of contamination), reduction of mechanical disturbances of the projection system and/or the substrate table, improved utilization of space on the substrate table (as no separate closing plate need be provided on the substrate table) and elimination of drying spots on the projection system. Additionally or alternatively, the closing plate according to an embodiment of the invention may avoid the need to remove (and then replace) the liquid or move the substrate vertically out of position so that a closing plate may be put in its place. Changes in liquid, gas and vacuum flows may take time to settle and vertical movement may cause disturbances on the projection system and on the substrate table. Turning to FIGS. 6 to 9, FIGS. 6*a*, 7*a*, 8*a* and 9*a* show plan views of the substrate table WT and actuated closing plate 20 in relation to the projection system PL. FIGS. 6*b*, 7*b*, 8*b* and 9*b* show side views of the substrate table WT and actuated closing plate 20 in relation to the projection system PL.

Figure 6A:
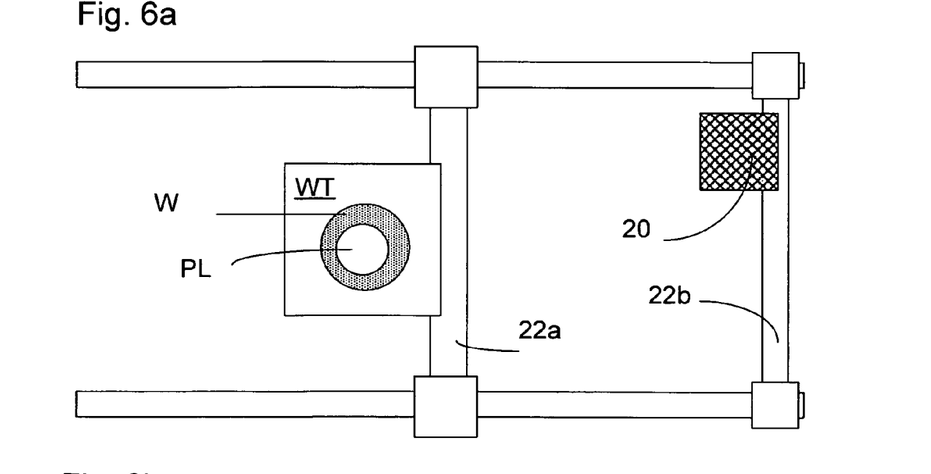
FIGS. 6a and 6b show a first step in the method according to an embodiment of the present invention.
Figure 6B:
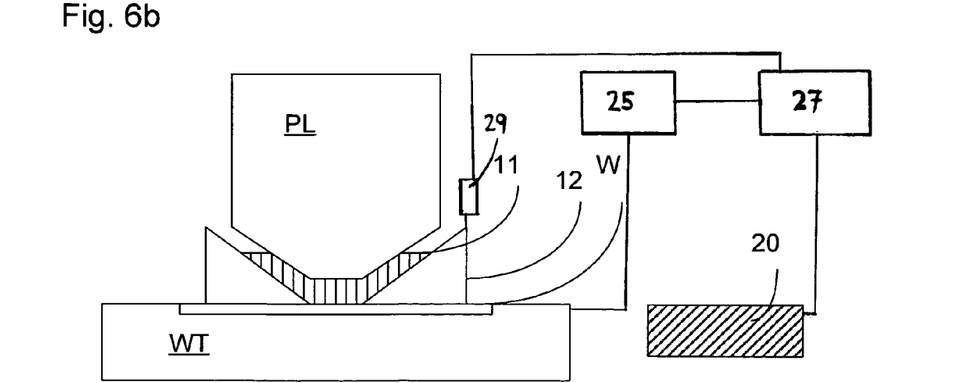

FIGS. 6*a* and 6*b* show the relative positions of the substrate table WT and the actuated closing plate 20 during, for example, exposure of the substrate W. The closing plate is out of the way of the projection system PL and the substrate W is lined up with the projection system PL.

Figure 7A:
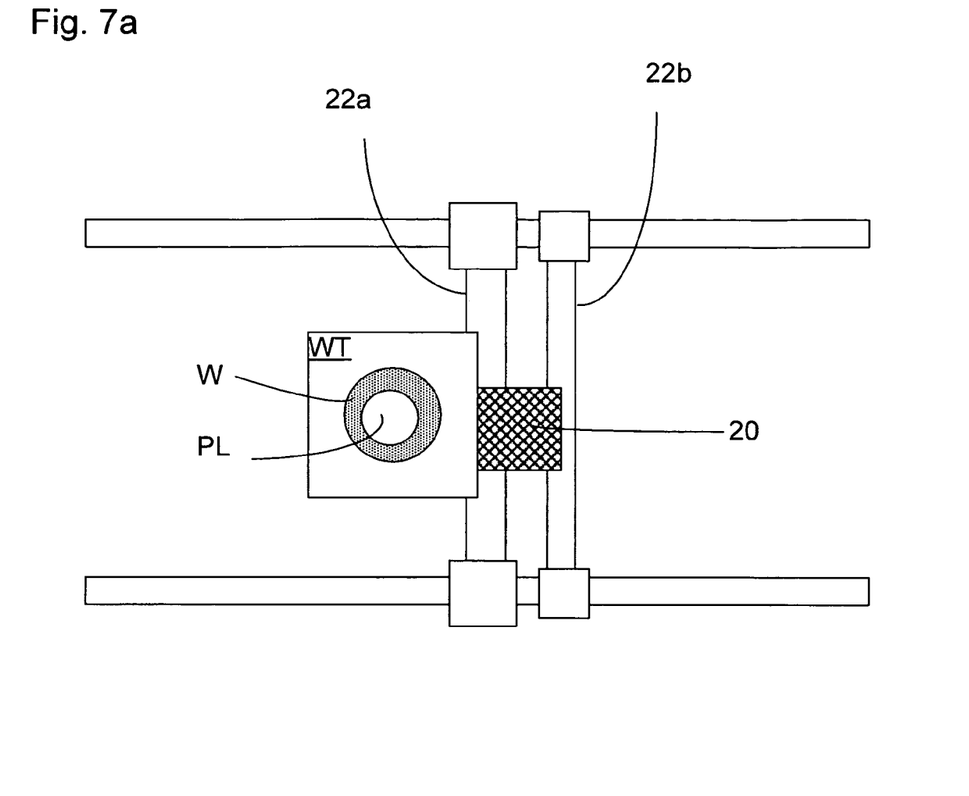
FIGS. 7a and 7b show a second step in the method according to an embodiment of the present invention.
Figure 7B:
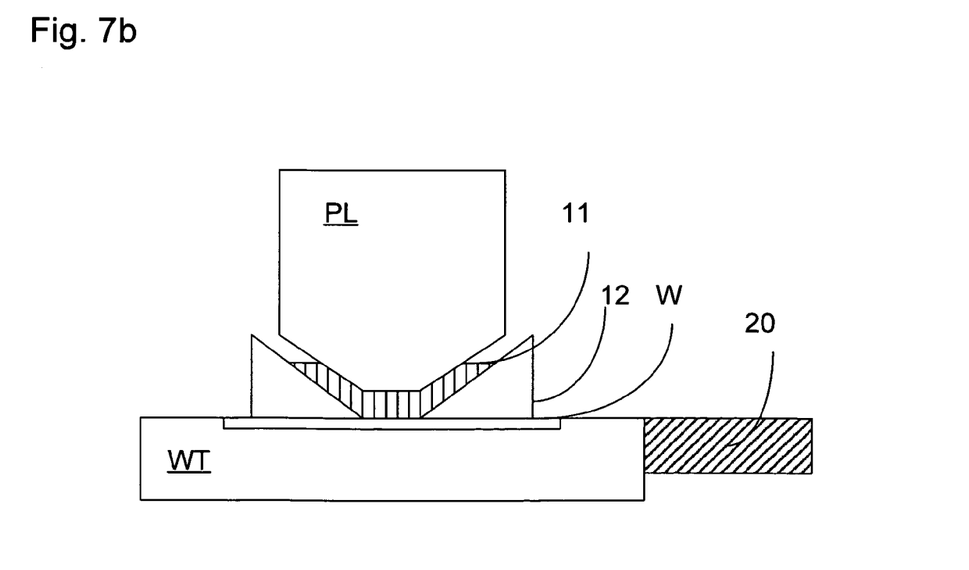

FIGS. 7*a* and 7*b* show the relative positions of the substrate table WT and the actuated closing plate 20 when, for example, exposure of the substrate W is complete or nearly complete. The actuated closing plate 20 is moved into a position such that it is aligned horizontally with the substrate table WT and vertically with the projection system PL.

Figure 8A:
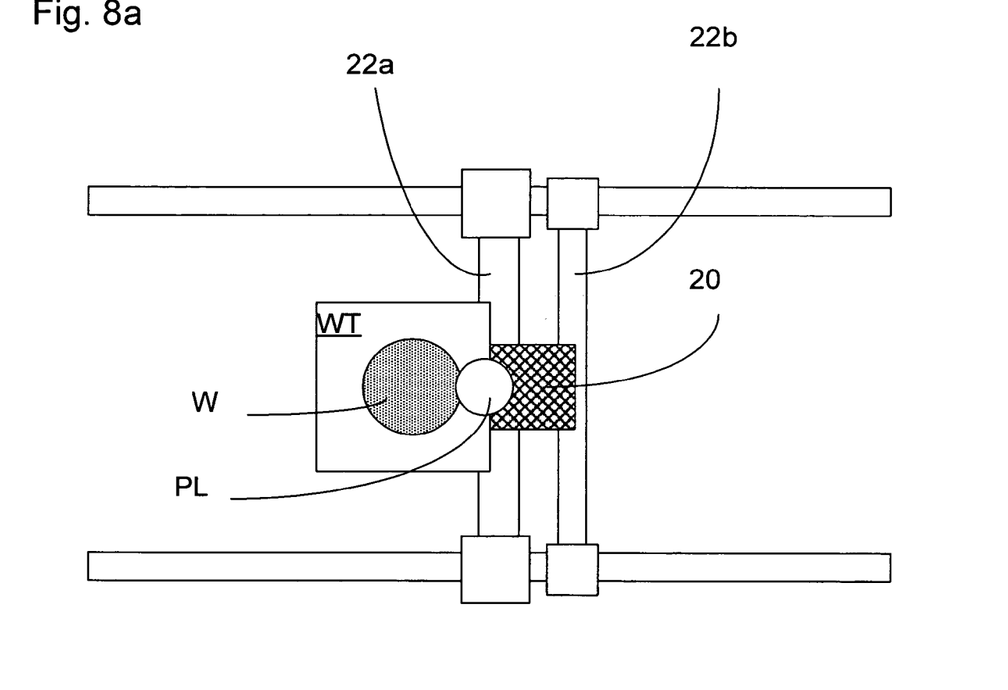
FIGS. 8a and 8b show a third step in the method according to an embodiment of the present invention.
Figure 8B:
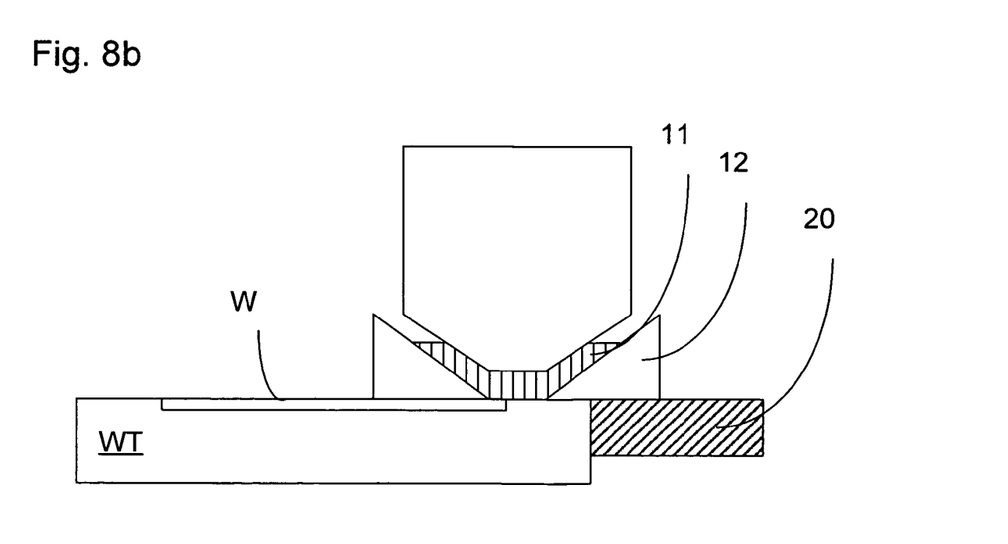

FIGS. 8*a* and 8*b* show the actuated closing plate 20 replacing the substrate table WT once, for example, the exposure of the substrate W is complete. Both the actuated closing plate 20 and the substrate table WT move in the same direction, at the same horizontal level.

Figure 9A:
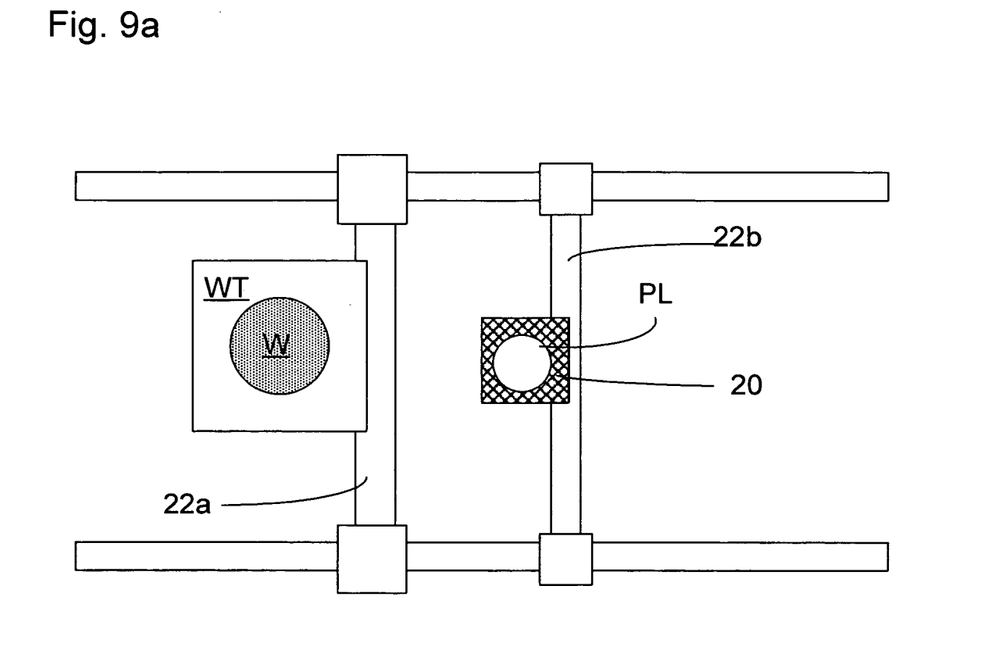
FIGS. 9a and 9b show a fourth step in the method according to an embodiment of the present invention.
Figure 9B:
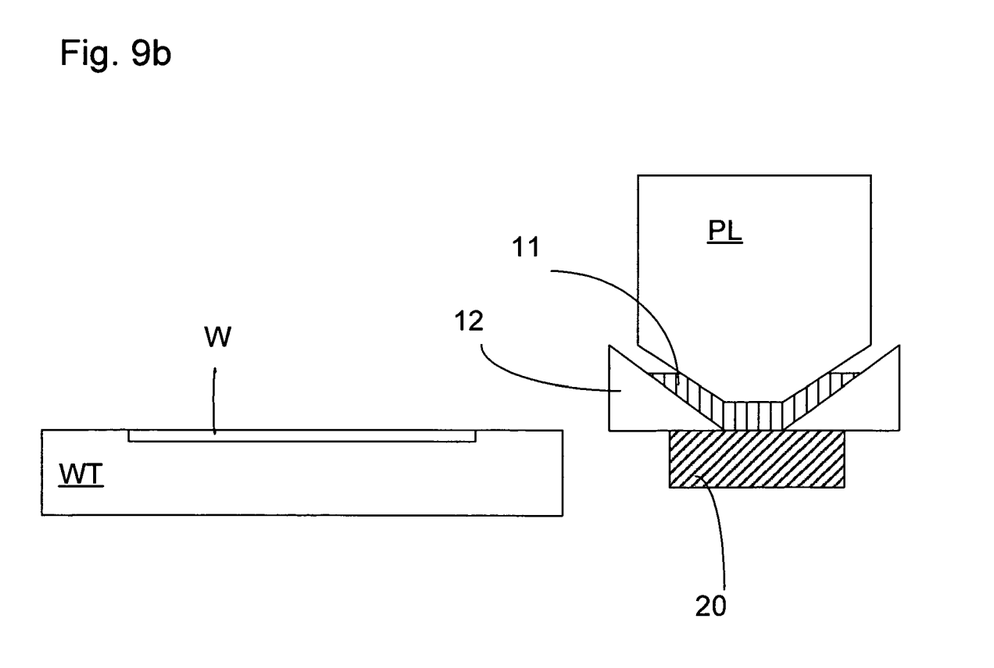

FIGS. 9*a* and 9*b* show the actuated closing plate 20 in position under the projection system PL with the actuated closing plate 20 acting as one side of the boundary containing the liquid 11. The substrate W can now, for example, be swapped with another substrate W on the substrate table WT and the liquid 11 has not been disturbed.

An advantage of this system is that the liquid confinement structure 12, the projection system PL, the substrate W and/or the actuated closing plate 20 is not disturbed throughout a substrate exchange procedure. Furthermore, there may be no vertical movement of the substrate table WT and/or the actuated closing plate 20 so that the risk of gas being introduced into the liquid supply system is reduced.

Furthermore, the substrate table WT may comprise an active compensator 25 configured to compensate for a change in force when a force exerted by the liquid confinement structure is removed from it. This compensator may comprise a vertical motion sensor and/or a pressure sensor on the substrate table and a control system configured to send a compensation signal to, for example, a substrate table positioner PW, the substrate table positioner PW configured to move the substrate table WT in response to the signal to compensate for the change in force. Additionally or alternatively, the actuated closing plate 20 may comprise an active compensator 27 in order to reduce the disturbance on the liquid confinement structure caused, for example, when the liquid confinement structure is removed from it. This compensator may comprise a vertical motion sensor and/or a pressure sensor on the actuated closing plate 20 and a control system configured to send a compensation signal to, for example, a liquid confinement system positioner 29, the liquid confinement system positioner 29 configured to move the liquid confinement structure 12 in response to the signal to compensate for the change in force.

The substrate table WT and the actuated closing plate 20 are releasably coupleable. This means that they may be attached together when the actuated closing plate 20 is replacing the substrate table WT and vice versa; but they can be detached from each other once the replacement is complete. The actuated closing plate 20 and substrate table WT may similarly be controlled by the same system 25 or 27 or by separate systems 25 and 27. Separate long stroke actuators 22*a* and 22*b* as shown in the Figures may be used; but the separate actuators may be controlled by the same 25 or 27 or different control systems 25 and 27.

In an embodiment, forces on the actuated closing plate 20 may be measured, for example, by the actuated closing plate active compensator 27 and fed-forward to a control system (e.g., active compensator 25) of the substrate table WT so that the forces acting on the actuated closing plate 20 will be compensated for and thereby not affect the substrate table WT. In this way, the actuated closing plate 20 may work as a force measurement system for the substrate table WT.

While one or more embodiments may have been discussed in relation to removing a substrate from the substrate table and placing another substrate on the substrate table, one or more embodiments herein may be used in other applications. For example, the substrate may be kept on the substrate table but the closing plate is used simply to close the liquid confinement structure. Further, while one or more embodiments may have been discussed in terms of the substrate acting as the boundary of the space between the projection system and the substrate, the substrate table may independently or in conjunction with the substrate form a part of the boundary of the space. For example, a portion of the substrate table (e.g., an alignment mark) may be positioned under the liquid confinement structure and form a part of the boundary of the space. Accordingly, the closing plate may replace the substrate table as a part of the boundary of the space, or vice versa.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the present invention may be applied to any immersion lithography apparatus, in particular, but not exclusively, to those types mentioned above. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus, comprising:
a substrate table configured to hold a substrate;
a projection system configured to project a patterned beam of radiation onto the substrate;
a liquid confinement structure configured to confine a liquid in a space between the projection system and the substrate, the substrate, the substrate table, or both, configured to form a part of a boundary of the space; and
a closing plate configured to form a part of a boundary of the space in place of the substrate, the substrate table, or both, when moved without substantially disturbing the liquid, the liquid confinement structure, or both,
wherein (i) the substrate table comprises an active compensator configured to compensate for a change in load on the substrate table in a direction perpendicular to a direction of movement of the substrate table due to the replacement of the substrate, the substrate table, or both, with the closing plate as a part of the boundary of the space, or (ii) the closing plate comprises an active compensator configured to compensate for a change in load on the liquid confinement structure in a direction perpendicular to a direction of movement of the substrate table due to replacement of the closing plate with the substrate, the substrate table, or both, as a part of the boundary of the space, or (iii) both (i) and (ii).

2. The apparatus according to claim 1, comprising an actuator configured to move the closing plate along a horizontal plane to form the part of the boundary of the space in place of the substrate, the substrate table, or both.

3. The apparatus according to claim 1, comprising an actuator configured to move the closing plate in a same plane as the substrate, the substrate table, or both, and to follow the substrate, the substrate table, or both, across the liquid confinement structure.

4. The apparatus according to claim 1, wherein the substrate table and the closing plate are releasably coupleable.

5. The apparatus according to claim 1, comprising a first actuator configured to move the closing plate and a separate second actuator configured to move the substrate table.

6. The apparatus according to claim 1, wherein the closing plate is at a same vertical level as the substrate table and neither the closing plate nor the substrate table is moved out of the vertical level to replace the substrate, the substrate table, or both, with the closing plate as a part of the boundary of the space, to replace the closing plate with the substrate, the substrate table, or both as a part of the boundary of the space, or both.

7. The apparatus according to claim 1, wherein the liquid supply system is configured to constantly circulate the liquid in a flow pattern and the flow pattern is not disturbed by the replacement of the closing plate with the substrate, the substrate table, or both as a part of the boundary of the space, replacement of the substrate, the substrate table, or both with the closing plate as a part of the boundary of the space, or both.

8. A device manufacturing method, comprising:
providing a liquid to a space through which a patterned beam passes, a substrate, a substrate table, or both, forming a part of a boundary of the space;
sealing the liquid to the space, the seal acting between the substrate, a substrate table, or both, and another structure;
replacing the substrate, the substrate table, or both, with a closing plate as the part of the boundary of the space without breaking the seal;
compensating for a change in load (i) on the substrate table in a direction perpendicular to a direction of movement of the substrate table due to the replacement of the substrate, the substrate table, or both, with the closing plate as a part of the boundary of the space, or (ii) on a liquid confinement structure, used to at least partly confine the liquid in the space, in a direction perpendicular to a direction of movement of the substrate table due to replacement of the closing plate with the substrate, the substrate table, or both, as a part of the boundary of the space, or (iii) both (i) and (ii); and
projecting a patterned beam of radiation through the liquid onto the substrate.

9. The method according to claim 8, comprising moving the closing plate along a horizontal plane to form the part of the boundary of the space in place of the substrate, the substrate table, or both.

10. The method according to claim 8, comprising moving the closing plate in a same plane as the substrate, the substrate table, or both, and to follow the substrate, the substrate table, or both.

11. The method according to claim 8, comprising releasably coupling the substrate table and the closing plate.

12. The method according to claim 8, comprising separately moving the closing plate and the substrate table.

13. The method according to claim 8, wherein the closing plate is at a same vertical level as the substrate table and neither the closing plate nor the substrate table is moved out of the vertical level to replace the substrate, the substrate table, or both, with the closing plate as a part of the boundary of the space, to replace the closing plate with the substrate, the substrate table, or both as a part of the boundary of the space, or both.

14. The method according to claim 8, wherein the liquid is constantly circulated in a flow pattern and the flow pattern is not disturbed by the replacement of the closing plate with the substrate, the substrate table, or both as a part of the boundary of the space, replacement of the substrate, the substrate table, or both with the closing plate as a part of the boundary of the space, or both.

15. A lithographic projection apparatus, comprising:
a substrate table configured to hold a substrate;
a projection system configured to project a patterned beam of radiation onto the substrate;
a liquid confinement structure configured to confine a liquid in a space between the projection system and the substrate, the substrate, the substrate table, or both, configured to form a part of a boundary of the space;
a closing plate displaced in a horizontal plane from the substrate table and configured to form a part of a boundary of the space in place of the substrate, the substrate table, or both;
an actuator configured to move the closing plate in the horizontal plane at least part of the time separately from the substrate table, and
wherein the substrate table and the closing plate are releasably coupleable.

16. The apparatus according to claim 15, wherein the actuator is configured to move the closing plate in a same plane as the substrate, the substrate table, or both, and to follow the substrate, the substrate table, or both, across the liquid confinement structure.

17. The apparatus according to claim 15, wherein the substrate table comprises an active compensator configured to compensate for a change in load on the substrate table in a direction perpendicular to a direction of movement of the substrate table due to the replacement of the substrate, the substrate table, or both, with the closing plate as a part of the boundary of the space.

18. The apparatus according to claim 15, wherein the closing plate comprises an active compensator configured to compensate for a change in load on the liquid confinement structure in a direction perpendicular to a direction of movement of the substrate table due to replacement of the closing plate with the substrate, the substrate table, or both, as a part of the boundary of the space.

19. The apparatus according to claim 15, comprising a separate actuator configured to move the substrate table.

20. The apparatus according to claim 19, comprising a controller configured to separately control the closing plate and the substrate table.

21. The apparatus according to claim 15, wherein the actuator is configured to move both the closing plate and the substrate table.

22. The apparatus according to claim 15, wherein the closing plate is at a same vertical level as the substrate table and neither the closing plate nor the substrate table is moved out of the vertical level to replace the substrate, the substrate table, or both, with the closing plate as a part of the boundary of the space, to replace the closing plate with the substrate, the substrate table, or both as a part of the boundary of the space, or both.

23. The apparatus according to claim 15, wherein the actuator comprises a long stroke actuator and comprises a long stroke actuator configured to move the substrate table.

24. The apparatus according to claim 15, wherein the liquid supply system is configured to constantly circulate the liquid in a flow pattern and the flow pattern is not disturbed by the replacement of the closing plate with the substrate, the substrate table, or both as a part of the boundary of the space, replacement of the substrate, the substrate table, or both with the closing plate as a part of the boundary of the space, or both.

* * * * *